United States Patent
Tong et al.

(10) Patent No.: US 10,103,447 B2
(45) Date of Patent: Oct. 16, 2018

(54) INTEGRATED CIRCUIT PACKAGE WITH RADIO FREQUENCY COUPLING STRUCTURE

(71) Applicants: Ziqiang Tong, Munich (DE); Ralf Reuter, Munich (DE)

(72) Inventors: Ziqiang Tong, Munich (DE); Ralf Reuter, Munich (DE)

(73) Assignee: NXP USA, Inc., Austin, TX (US)

( * ) Notice: Subject to any disclaimer, the term of this patent is extended or adjusted under 35 U.S.C. 154(b) by 58 days.

(21) Appl. No.: 14/303,713

(22) Filed: Jun. 13, 2014

(65) Prior Publication Data
US 2015/0364830 A1    Dec. 17, 2015

(51) Int. Cl.
*H01Q 19/10*    (2006.01)
*H01L 31/18*    (2006.01)
(Continued)

(52) U.S. Cl.
CPC ............ *H01Q 19/10* (2013.01); *G01S 7/03* (2013.01); *G01S 13/08* (2013.01); *H01L 23/66* (2013.01);
(Continued)

(58) Field of Classification Search
CPC ...... H01Q 19/10; H01Q 19/185; H01L 31/12; G01S 13/02
(Continued)

(56) References Cited

U.S. PATENT DOCUMENTS 2,897,409 A    7/1959    Gitto
3,417,393 A    12/1968    Cooke
(Continued)

FOREIGN PATENT DOCUMENTS

EP    1367668 A1    12/2003
EP    1923950 A1    5/2008
(Continued)

OTHER PUBLICATIONS

Fischer, A. et al., "A 77-GHz antenna and fully integrated radar transceiver in package," International Journal of Microwave and Wireless Technologies 2012; vol. 4, issue 4; Aug. 2012; 7 pages.
(Continued)

*Primary Examiner* — Dieu H Duong
*Assistant Examiner* — Bamidele A Jegede
(74) *Attorney, Agent, or Firm* — Charlene R. Jacobsen

(57) ABSTRACT

An integrated circuit package comprises an electrically conductive material, a first electrically isolating layer having a first side in contact with the electrically conductive material and a second side opposite to the first side, a second electrically isolating layer stacked at the second side with at least the first electrically isolating layer and arranged at a package side, and an integrated antenna structure arranged between the first electrically isolating layer and the second electrically isolating layer. The electrically conductive material is encapsulated by a dielectric material, arranged to partly overlap the integrated antenna structure, separated from the integrated antenna structure by at least the first electrically isolating layer and arranged to reflect a radio frequency signal received by the electrically conductive material through at least the first electrically isolating layer to the package side.

17 Claims, 7 Drawing Sheets

(51) Int. Cl.

| | | |
|---|---|---|
| *H01L 31/0203* | (2014.01) | |
| *G01S 7/03* | (2006.01) | |
| *G01S 13/08* | (2006.01) | |
| *H01Q 9/04* | (2006.01) | |
| *H01Q 23/00* | (2006.01) | |
| *H01L 23/66* | (2006.01) | |
| *H01L 23/00* | (2006.01) | |
| *G01S 13/93* | (2006.01) | |
| *G01S 7/02* | (2006.01) | |
| *H01P 5/107* | (2006.01) | |
| *H01L 21/56* | (2006.01) | |

(52) U.S. Cl.
CPC ............ *H01L 24/20* (2013.01); *H01L 24/96* (2013.01); *H01L 31/0203* (2013.01); *H01L 31/18* (2013.01); *H01Q 9/0407* (2013.01); *H01Q 23/00* (2013.01); *G01S 13/931* (2013.01); *G01S 2007/028* (2013.01); *H01L 21/568* (2013.01); *H01L 2223/6677* (2013.01); *H01L 2223/6688* (2013.01); *H01L 2224/04105* (2013.01); *H01L 2224/12105* (2013.01); *H01L 2224/16227* (2013.01); *H01L 2924/1033* (2013.01); *H01L 2924/10253* (2013.01); *H01L 2924/10271* (2013.01); *H01L 2924/10329* (2013.01); *H01L 2924/15311* (2013.01); *H01L 2924/15321* (2013.01); *H01P 5/107* (2013.01)

(58) Field of Classification Search
USPC ................. 343/834, 836; 342/175; 438/27
See application file for complete search history.

(56) References Cited

U.S. PATENT DOCUMENTS

| | | | |
|---|---|---|---|
| 4,737,395 A | 4/1988 | Mabuchi | |
| 4,775,611 A | 10/1988 | Sullivan | |
| 4,861,640 A | 8/1989 | Gurol | |
| 5,374,788 A | 12/1994 | Endoh | |
| 5,490,965 A | 2/1996 | Christiansen | |
| 5,619,791 A | 4/1997 | Lambrech, Jr. | |
| 6,081,241 A | 6/2000 | Josefsson | |
| 6,083,340 A | 6/2000 | Nomura | |
| 6,207,221 B1 | 3/2001 | Schulz-Harder | |
| 6,563,712 B2* | 5/2003 | Akram | H01L 23/3121 |
| | | | 165/185 |
| 6,686,649 B1* | 2/2004 | Mathews | H01L 23/552 |
| | | | 257/659 |
| 6,713,685 B1 | 3/2004 | Cotton | |
| 6,740,576 B1 | 5/2004 | Lin | |
| 6,910,266 B2 | 6/2005 | Lee | |
| 6,982,674 B2 | 1/2006 | Matsubara et al. | |
| 7,126,541 B2 | 10/2006 | Mohamadi | |
| 7,126,542 B2 | 10/2006 | Mohamadi | |
| 7,129,567 B2 | 10/2006 | Kirby | |
| 7,151,228 B2 | 12/2006 | Takase | |
| 7,164,898 B2 | 1/2007 | Hankui | |
| 7,239,526 B1 | 7/2007 | Bibee | |
| 7,326,858 B2 | 2/2008 | Lee | |
| 7,394,027 B2 | 7/2008 | Kaluzni et al. | |
| 7,435,911 B2 | 10/2008 | Kim | |
| 7,468,894 B2 | 12/2008 | Bibee | |
| 7,728,774 B2 | 6/2010 | Akkermans | |
| 7,755,174 B2 | 7/2010 | Rollin | |
| 7,767,913 B2 | 8/2010 | Corisis | |
| 7,808,439 B2 | 10/2010 | Yang et al. | |
| 7,868,257 B2 | 1/2011 | Kushta | |
| 7,886,421 B2* | 2/2011 | Hwan | H01L 23/645 |
| | | | 29/600 |
| 7,999,753 B2* | 8/2011 | Gaucher | H01Q 1/38 |
| | | | 343/828 |
| 8,013,257 B2 | 9/2011 | Furuya | |
| 8,031,474 B2 | 10/2011 | Ogawa | |
| 8,169,060 B2 | 5/2012 | Maurer et al. | |
| 8,199,060 B2 | 6/2012 | Rofougaran | |
| 8,242,384 B2 | 8/2012 | Cases | |
| 8,283,764 B2 | 10/2012 | Tang | |
| 8,305,280 B2 | 11/2012 | Brown et al. | |
| 8,460,967 B2* | 6/2013 | Lachner | H01Q 1/2283 |
| | | | 257/E21.499 |
| 8,497,804 B2 | 6/2013 | Haubrich | |
| 8,633,858 B2 | 1/2014 | Nair | |
| 8,860,532 B2 | 10/2014 | Gong et al. | |
| 9,444,135 B2 | 9/2016 | Tong et al. | |
| 9,615,447 B2 | 4/2017 | Hurwitz | |
| 2002/0191380 A1 | 12/2002 | Val | |
| 2003/0080836 A1 | 5/2003 | Nagaishi | |
| 2003/0100197 A1 | 5/2003 | Veitschegger | |
| 2003/0141348 A1 | 7/2003 | Tsay | |
| 2004/0118600 A1 | 6/2004 | Lee | |
| 2005/0000816 A1 | 1/2005 | Lin | |
| 2005/0069277 A1 | 3/2005 | Nakazawa | |
| 2005/0224989 A1 | 10/2005 | Myers | |
| 2006/0097906 A1 | 5/2006 | Heide | |
| 2006/0131729 A1 | 6/2006 | Lee | |
| 2006/0144617 A1 | 7/2006 | Kim | |
| 2006/0204652 A1 | 9/2006 | Meier | |
| 2007/0013581 A1 | 1/2007 | Iijima | |
| 2007/0017697 A1 | 1/2007 | Hsu | |
| 2007/0080864 A1 | 4/2007 | Channabasappa | |
| 2007/0211403 A1 | 9/2007 | Sievenpiper | |
| 2007/0221405 A1 | 9/2007 | Cheng | |
| 2008/0007927 A1 | 1/2008 | Ito | |
| 2008/0042248 A1 | 2/2008 | Nalla | |
| 2008/0060194 A1 | 3/2008 | Liao | |
| 2008/0079118 A1 | 4/2008 | Bang | |
| 2008/0180878 A1 | 7/2008 | Kim | |
| 2008/0197469 A1 | 8/2008 | Yang | |
| 2008/0272964 A1 | 11/2008 | Su | |
| 2008/0297283 A1 | 12/2008 | Byun | |
| 2009/0015485 A1* | 1/2009 | Floyd | H01Q 9/0457 |
| | | | 343/700 MS |
| 2009/0057912 A1 | 3/2009 | Kheng | |
| 2009/0207080 A1 | 8/2009 | Floyd | |
| 2009/0256752 A1 | 10/2009 | Akkermans | |
| 2010/0001906 A1 | 1/2010 | Akkermans | |
| 2010/0103024 A1 | 4/2010 | Schultheiss | |
| 2010/0193935 A1* | 8/2010 | Lachner | H01Q 1/2283 |
| | | | 257/693 |
| 2010/0206617 A1 | 8/2010 | Corisis | |
| 2010/0245155 A1 | 9/2010 | Miyazato | |
| 2011/0057743 A1 | 3/2011 | Shimura | |
| 2011/0234472 A1* | 9/2011 | Maurer | H01L 23/66 |
| | | | 343/904 |
| 2012/0013499 A1* | 1/2012 | Hayata | G01S 7/032 |
| | | | 342/112 |
| 2012/0086114 A1 | 4/2012 | Zhao | |
| 2012/0104574 A1 | 5/2012 | Boeck | |
| 2012/0111726 A1 | 5/2012 | Couto Petri | |
| 2012/0119969 A1 | 5/2012 | MacDonald et al. | |
| 2012/0128291 A1 | 5/2012 | Teitelbaum | |
| 2012/0182066 A1 | 7/2012 | Merkle | |
| 2012/0188138 A1* | 7/2012 | Liu | H01Q 1/2283 |
| | | | 343/776 |
| 2012/0256795 A1 | 10/2012 | Tajima | |
| 2012/0274419 A1 | 11/2012 | Lee et al. | |
| 2013/0012145 A1 | 1/2013 | Shibuya | |
| 2013/0021208 A1 | 1/2013 | Seok | |
| 2013/0050016 A1 | 2/2013 | Kim | |
| 2013/0074332 A1 | 3/2013 | Suzuki | |
| 2013/0171752 A1 | 7/2013 | Val | |
| 2013/0207274 A1* | 8/2013 | Liu | H01L 23/66 |
| | | | 257/774 |
| 2013/0256850 A1 | 10/2013 | Danny | |
| 2014/0262448 A1 | 9/2014 | Kato | |
| 2014/0300521 A1* | 10/2014 | Junemann | H01Q 1/38 |
| | | | 343/770 |
| 2015/0181693 A1 | 6/2015 | Wu | |
| 2015/0346322 A1 | 12/2015 | Schmalenberg | |

(56) References Cited

U.S. PATENT DOCUMENTS

| | | | |
|---|---|---|---|
| 2015/0364829 A1 | 12/2015 | Tong | |
| 2015/0364830 A1 | 12/2015 | Tong | |
| 2015/0382469 A1 | 12/2015 | Hu | |

FOREIGN PATENT DOCUMENTS

| | | |
|---|---|---|
| EP | 2500978 B1 | 7/2013 |
| WO | 2012140422 A2 | 10/2012 |

OTHER PUBLICATIONS

Fischer, A. et al., "A 77-GHz Antenna in Package," 2011 IEEE 41st European Microwave Conference, Oct. 10-13, 2011; pp. 1316-1319.

Wojnowski, M. et al., "A 77-GHz SiGe Single-Chip Four-Channel Transceiver Module with Integrated Antennas in Embedded Wafer-Level BGA Package," IEEE 62nd Electronic Components and Technology Conference; May 29, 2012-Jun. 1, 2012; pp. 1027-1032.

Yang, F. et al., "Microstrip Antenna Integrated With Electromagnetic Band-Gap (EBG) Structures: A Low Mutual Coupling Design for Array Applications," IEEE Transaction on Antennas and Propagation, vol. 51, N. 10; Oct. 2003; pp. 2936-2946.

U.S. Appl. No. 14/490,849, filed Sep. 19, 2014, entitled "Integrated Circuit Package".

Do-Hoon, K. et al., "A Wideband Vertical Transition Between Co-Planar Waveguide and Parallel-Strip Transmission," IEEE Microwave and Wireless Components Letters, vol. 15, No. 9, Sep. 2005, pp. 591-593.

U.S. Appl. No. 14/473,038, filed Aug. 29, 2014, entitled "Radio Frequency Coupling Structure and a Method of Manufacturing Thereof".

Alleaume, P.F., et al., "Millimeter-wave SMT Low Cost Plastic Packages for Automotive Radar at 77GHz and High Data Rate E-band Radios," 2009 IEEE MTT-S International Microwave Symposium Digest (IMS), Jun. 7-12, 2009; pp. 789-792.

Deslandes, Dominic, "Design Equations for Tapered Microstrip-to-Substrate Integrated Waveguide Transitions," 2010 IEEE MTT-S International Microwave Symposium Digest (MTT); May 23-28, 2019, pp. 704-707.

Glogowski, R. et al., "Double Resonance Transition from Rectangular Waveguide to Substrate Integrated Waveguide," 2013 IEEE 7th European Conference on Antennas and Propagation (EuCAP); Apr. 8-12, 2013; pp. 3353-3354.

Henawy, M.A., et al., "Integrated Antennas in eWLB Packages for 77 GHz and 79 GHz Automotive Radar Sensors," Proceedings of the 8th European Radar Conference; Oct. 12-14, 2011, Manchester, UK; pp. 424-427.

Keser, B. et al., "The Redistributed Chip Package: A Breakthrough for Advanced Packaging," Proceedings of the 57th IEEE Electronic Components and Technology Conference, 2007; May 29, 2007-Jun. 1, 2007; pp. 286-291.

Lamy, Y. et al., "mmW Characterization of Wafer Level Passivation for 3D Silicon Interposer," 2013 IEEE 63rd Electronic Components & Technology Conference; May 28-31, 2013; pp. 1187-1981.

Pohl, N. et al., "An UWB 80GHz FMCW Radar System Using a SiGe Bipolar Transceiver Chip Stabilized by a Fractional-N PII Synthesizer," IEEE Transactions on Microwave Theory and Techniques, vol. 60, No. 3, Mar. 2012, pp. 757-765.

Schmid, C.M. et al., "A 77-GHz FMCW Radar Transceiver MMIC / Waveguide Integration Approach," 2013 IEEE MTT-S International Microwave Symposium Digest (IMS); Jun. 2-7, 2013; pp. 1-4.

Trotta, S. et al., "An RCP Packaged Transceiver Chipset for Automotive LRR and SRR Systems in SiGe BiCMOS Technology," IEEE Transactions on Microwave Theory and Techniques, vol. 60, No. 3, Mar. 2012, pp. 778-794.

U.S. Appl. No. 14/303,705, filed Jun. 13, 2014, entitled "Radio Frequency Coupling Structure".

U.S. Appl. No. 14/303,707, filed Jun. 13, 2014, entitled "Integrated Circuit Package with Radio Frequency Coupling Arrangement".

Notice of Allowance dated Aug. 31, 2016 for U.S. Appl. No. 14/303,705, 8 pages.

Non-Final Office Action dated Jan. 14, 2016 for U.S. Appl. No. 14/303,705, 7 pages.

Non-Final Office Action dated Feb. 17, 2016 for U.S. Appl. No. 14/303,713, 15 pages.

Non-Final Office Action dated Feb. 16, 2016 for U.S. Appl. No. 14/490,849, 7 pages.

Final Office Action dated Jun. 23, 2016 for U.S. Appl. No. 14/303,705.

Non-Final Office Action dated Feb. 17, 2016 for U.S. Appl. No. 14/303,707, 14 pages.

Non-Final Office Action dated Oct. 6, 2016 for U.S. Appl. No. 14/303,707, 12 pages.

Notice of Allowance dated May 26, 2016 for U.S. Appl. No. 14/490,849 12 pages.

Notice of Allowance dated Dec. 21, 2016 for U.S. Appl. No. 14/303,705, 13 pages.

Final Office Action dated Mar. 24, 2017 for U.S. Appl. No. 14/303,707, 16 pages.

Non Final Office Action; U.S. Appl. No. 14/473,038; dated May 30, 2017.

Notice of Allowance; U.S. Appl. No. 14/473,038; dated Oct. 2, 2017.

Notice of Allowance U.S. Appl. No. 14/303,707; 20 pages (dated Jan. 25, 2018).

Non Final Office Action; U.S. Appl. No. 15/334,992; 49 pages (dated Jun. 25, 2018).

\* cited by examiner

INTEGRATED CIRCUIT PACKAGE WITH RADIO FREQUENCY COUPLING STRUCTURE

CROSS REFERENCE TO RELATED APPLICATIONS

The present application is related to co-pending U.S. patent application Ser. No. 14/303,705, entitled "RADIO FREQUENCY COUPLING STRUCTURE," filed on Jun. 13, 2014, and co-pending U.S. patent application Ser. No. 14/303,707, entitled "INTEGRATED CIRCUIT PACKAGE WITH RADIO FREQUENCY COUPLING ARRANGEMENT," filed on Jun. 13, 2014, the entirety of which are herein incorporated by reference.

FIELD OF THE INVENTION

This invention relates to an integrated circuit package, a radio frequency device, a radar sensor and a method of manufacturing an integrated circuit package.

BACKGROUND OF THE INVENTION

An integrated circuit package typically may integrate radio frequency (RF) active and passive components. Such integrated circuit package may for example be electrically coupled to a device external to the integrated circuit package. In order to implement a radio frequency coupling between the integrated circuit package and the external device, radio frequency coupling structures with low radiation losses may be desired.

Techniques are described in literature to improve the radio frequency coupling between an integrated circuit package and devices external to the integrated circuit package.

An example of such techniques is shown in U.S. Pat. No. 8,169,060 B2. U.S. Pat. No. 8,169,060 B2 describes an example of an integrated circuit package assembly arranged to transfer an electromagnetic signal from an integrated circuit package to a waveguide external to the integrated circuit package.

The integrated circuit package assembly disclosed in U.S. Pat. No. 8,169,060 B2 includes an integrated circuit package and a printed circuit board substrate. The printed circuit board substrate includes a waveguide. The integrated circuit package houses a first antenna that is configured to radiate a first electromagnetic signal. The waveguide generates a waveguide signal based on the first electromagnetic signal, and passes the waveguide signal to a second antenna that is electrically coupled to the waveguide. The second antenna is configured to radiate a second electromagnetic signal received from the waveguide. A conductive layer is formed over an external surface on the integrated circuit package, extends over a top dielectric layer of the integrated circuit package and reflects power radiated from the first antenna towards the waveguide.

However, the radio frequency coupling between the first antenna and the second antenna via the conductive layer and the waveguide cannot be controlled such that at the same time low radiation losses and good reproducibility of the radio frequency coupling are achieved.

SUMMARY OF THE INVENTION

The present invention provides an integrated circuit package, a radio frequency device, a radar sensor and a method of manufacturing an integrated circuit package as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
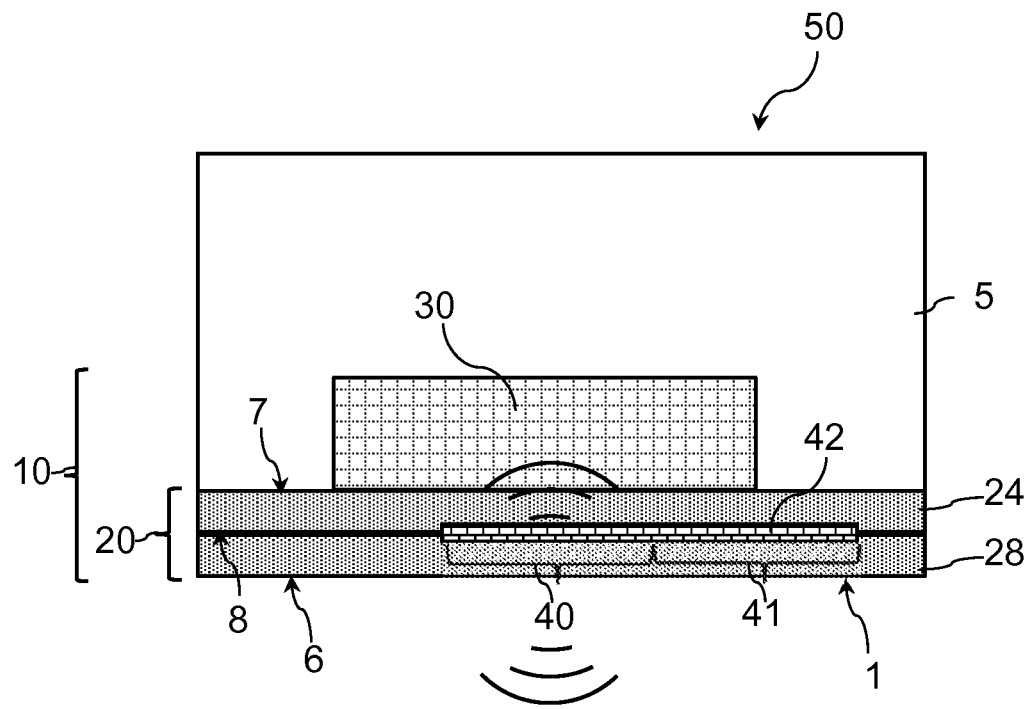
FIG. 1 shows a cross-section of an example of an integrated circuit package taken along the line I-I in FIG. 2.
Figure 2:
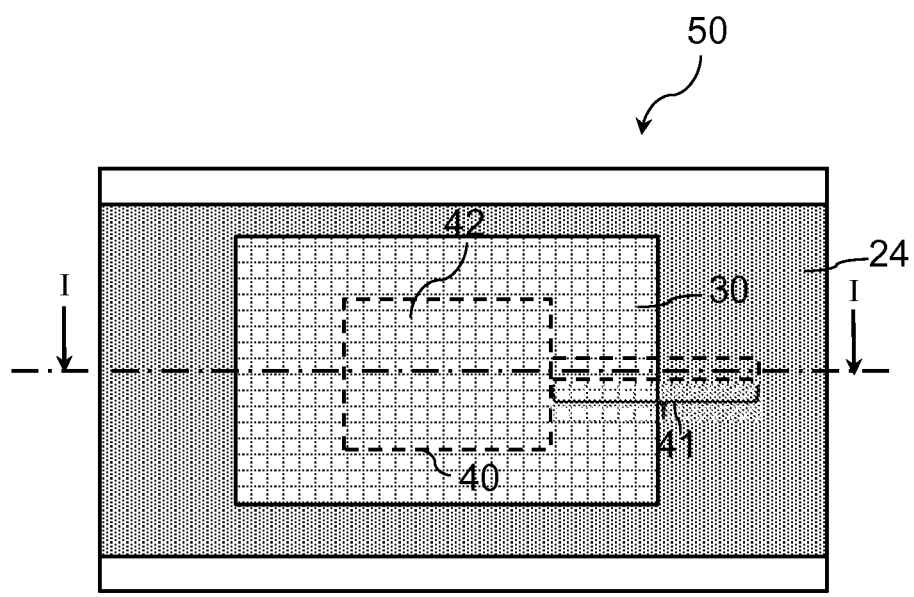
FIG. 2 shows a top view of the example shown in FIG. 1.

FIGS. 1 and 2 show a cross-section and a top view of an example of an integrated circuit package 50. The cross-section shown in FIG. 1 is taken along the line I-I of the top view shown in FIG. 2.

The integrated circuit package 50 comprises a radio frequency (RF) coupling structure 10 which is arranged inside the integrated circuit package 50. The RF coupling structure 10 comprises an electrically conductive material 30, a first electrically isolating layer 24, a second electrically isolating layer 28, and an integrated antenna structure 42 for transmitting and/or receiving a RF signal. The first electrically isolating layer 24 has a first side 7 in contact with the electrically conductive material 30 and a second side 8 opposite to the first side 7. The second electrically isolating layer 28 is stacked at the second side 8 with at least the first electrically isolating layer 24. The second electrically isolating layer 28 has a third side 6 arranged at a package side 1 of the integrated circuit package 52. The third side 6 of the second electrically isolating layer 28 is opposite to the first side 7 of the first electrically isolating layer 24. The integrated antenna structure 42 is arranged between the first electrically isolating layer 24 and the second electrically isolating layer 28.

The first electrically isolating layer 24, the second electrically isolating layer 28 and the integrated antenna structure 42 form a stack 20. The electrically conductive material is encapsulated by a dielectric material 5. The electrically conductive material 30 is arranged to partly overlap the integrated antenna structure 42. The electrically conductive material 30 is separated from the integrated antenna structure 42 by at least the first electrically isolating layer 24 and arranged to reflect the RF signal received by the electrically conductive material 30 through at least the first electrically isolating layer 24 to the package side 1.

The electrically conductive material 30 may have any shape suitable for the specific implementation. The electrically conductive material 30 partly overlaps the integrated antenna structure 42 such that the RF signal can reach the electrically conductive material 30 and be reflected back by the electrically conductive material 30. For example, as shown in FIG. 1, the electrically conductive material 30 may have a rectangular cuboid shape partly overlapping the integrated antenna structure 42. The electrically conductive material 30 may have a cylindrical shape or another solid shape with suitable thickness, e.g. in a range of 75-125 um or more. The electrically conductive material 30 may be made of high electrical conductivity material, for example copper. The electrically conductive material 30 may be electrically connected to a reference potential. The reference potential may be for example ground or a negative potential.

The RF signal may be generated by a transceiver (not shown in FIG. 1) electrically coupled to the integrated antenna structure 42 and therefrom radiated towards the electrically conductive material 30. The RF signal may be originated at the package side 1 from a device (not show in the FIG. 1) external to the integrated circuit package 50. The RF signal may thus be directly received from the package side 1 by the integrated antenna structure 42 or indirectly received by the integrated antenna structure 42 via one or multiple reflections in the electrically conductive material 30.

The integrated antenna structure 42 may be implemented in any manner suitable for the specific implementation.

The integrated antenna structure 42 may be an integrated planar antenna of one of the group consisting of: a single-ended microstrip antenna, a differential microstrip antenna, a rectangular patched single-ended antenna, a rectangular patched differential antenna, a square patched single-ended antenna, and a square patched differential antenna. The integrated antenna structure 42 may be, as shown in FIG. 1, sandwiched between the first electrically isolating layer 24 and the second electrically isolating layer 28.

For example, as shown in FIG. 2, the integrated antenna structure 42 may be a planar rectangular patched single-ended antenna. The planar rectangular patched single-ended antenna 42 may comprise a transmission line 41 and a planar rectangular patched element 40. The transmission line 41 may feed the rectangular patched element 40. The transmission line 41 may extend in a planar direction defined by the planar rectangular patched element 40 in a region of the stack 20 where the electrically conductive material 30 overlaps the planar rectangular patched element 40. The electrically conductive material 30 may completely overlap the planar rectangular patched element 40. Alternatively, the electrically conductive material 30 may partly overlap the planar rectangular patched element 40. The transmission line 41 may be electrically connected or coupled to a transceiver, a transmitter and/or a receiver. The rectangular patched element 40 and the transmission line 41 may be both made of a high conductive metal, e.g. copper.

Since the RF coupling structure 10 is entirely integrated in the integrated circuit package 50, the RF coupling structure 10 can be more compact and with less radiation losses as compared to existing prior art solutions. For example, in the integrated circuit package assembly described in U.S. Pat. No. 8,169,060 B2, the conductive material reflecting the radio frequency signal is located externally to the integrated circuit package, thereby making the integrated circuit package assembly mechanically more complex than in the present proposed solution.

The integrated circuit package 50 can be more mechanically stable as compared to prior art solutions because the integrated antenna structure 42, the electrically conductive material 30, the first electrically isolating layers 24 and the second electrically isolating layer 28 are assembled together inside the integrated circuit package 50. The dielectric material 5 encapsulating the RF coupling structure 10 may be used to obtain a more robust RF coupling structure 10. The dielectric material 5 may be a plastic moulding compound such for example a silica-filled epoxy moulding compound surrounding the electrically conductive material 30 and placed on top of the first electrically isolating layer 24. Furthermore, since the electrically conductive material 30 is placed inside the integrated circuit package 50, the electrically conductive material 30 may be better protected against environmental changes such as for example thermal stresses, moisture, etc.

Figure 3:
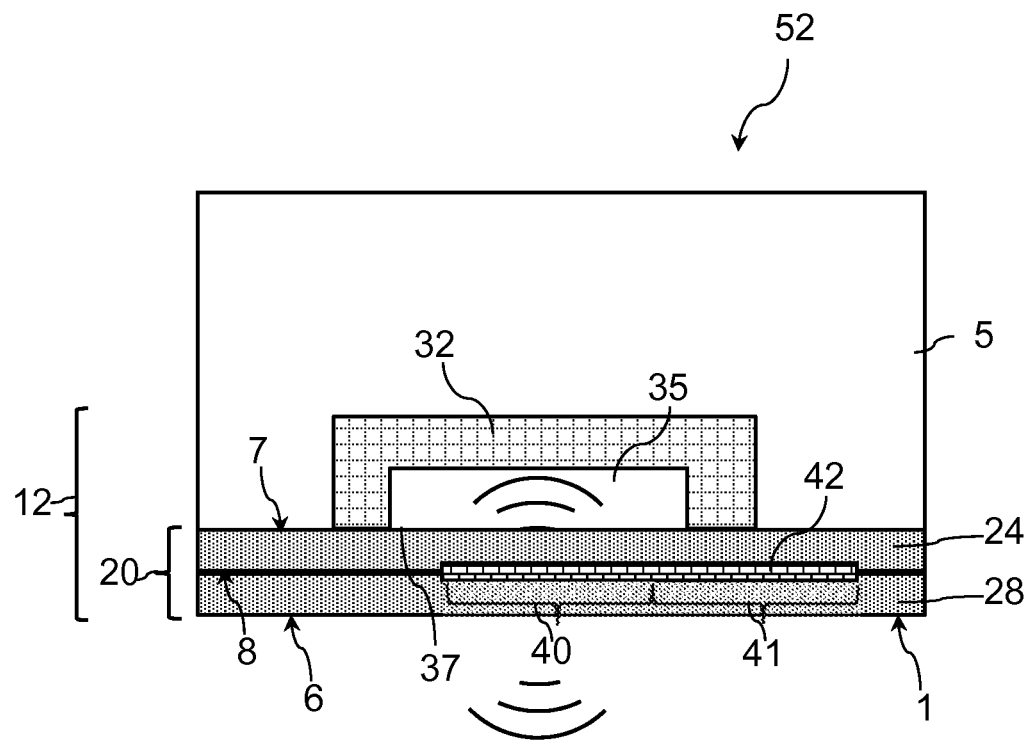
FIG. 3 shows a cross-section of an example of an integrated circuit package taken along the line III-III in FIG. 4.
Figure 4:
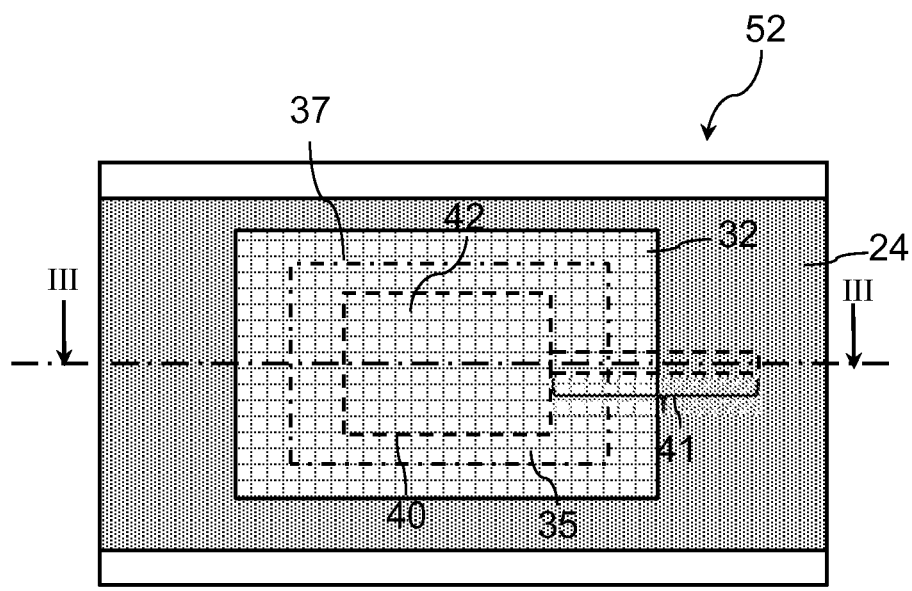
FIG. 4 shows a top view of the example shown in FIG. 3.

FIG. 3 and FIG. 4 show a cross-section and a top view of another example of an integrated circuit package 52. The cross-section shown in FIG. 3 is taken along the line III-III of the top view shown in FIG. 4. The integrated circuit package 52 comprises a RF coupling structure 12. The RF coupling structure 12 comprises an electrically conductive material 32, the integrated antenna structure 42 and the first electrically isolating layer 24 stacked at the second side 8 with the second electrically isolating layers 28 to form the stack 20. The integrated circuit package 52 shown in FIG. 3 differs from the integrated circuit package 50 shown in FIG. 1 in that the electrically conductive material 32 has a cavity 35. The electrically conductive material 32 may be formed with the cavity 35. The cavity 35 has at least an opening 37 facing the first side 7 of the first electrically isolating layer 24.

A position of the cavity 35 relative to the integrated antenna structure 42 may be arranged in any manner suitable for the specific implementation.

For example, as shown in FIGS. 3 and 4, the opening 37 of the cavity 35 may be substantially located at the centre of the electrically conductive material 32 overlapping the planar rectangular patched element 40. However, the opening 37 may be offset from the centre of the electrically conductive material 32. The opening 37 may partly overlap the integrated antenna structure 42. The cavity 35 may have one or more openings (not shown in FIG. 3) located for example at sides of the electrically conductive material 32 in a direction parallel to a surface of the first electrically isolating layer 24 in contact with the electrically conductive material 32.

The cavity 35 may be filled with any suitable dielectric material suitable for the specific implementation. For example, the cavity 35 may be filled with the same moulding compound 5 of the integrated circuit package 52, left empty, or filled with a gas, e.g. air, or another dielectric gas.

The cavity 35 may increase a physical distance between the integrated antenna structure 42 and the electrically conductive material 32, thereby enhancing a control of the size and electrical length of the integrated antenna structure 42. The dielectric material filling the cavity 35 may be chosen with a suitable dielectric constant to tune for example the frequency of operation of the integrated antenna structure 42 or to enhance a radiating efficiency of the integrated antenna structure 42.

Figure 5:
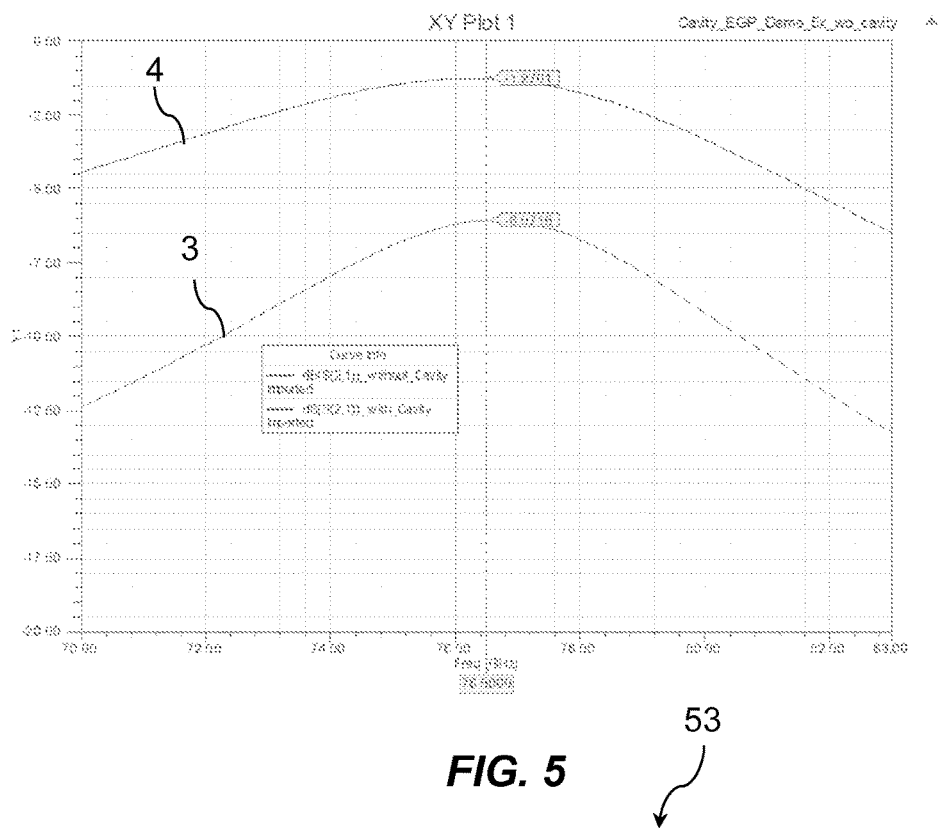
FIG. 5 graphically shows a comparison of the insertion losses obtained with an electromagnetic simulation of the integrated circuit packages of FIGS. 1-2 and FIGS. 3-4.

For example, FIG. 5 graphically shows a comparison of the insertion losses obtained with an electromagnetic simulation of the integrated circuit packages of FIGS. 1-2 and FIGS. 3-4, i.e. without and with the cavity 35. The insertion losses are calculated between an input of the integrated antenna structures 42 and an output at the package side 1. The graph of FIG. 5 shows two curves 3 and 4. Each of the two curves 3 and 4 shows a corresponding value of the insertion losses on the vertical axis and a corresponding value of the frequency on the horizontal axis. Curve 3 shows the insertion losses versus frequency obtained with the example of the integrated circuit package 50 comprising the RF coupling structure 10 without the cavity, as shown in FIGS. 1 and 2. Curve 4 shows the insertion losses versus frequency obtained with the example of the integrated circuit package 52 comprising the RF coupling structure 12 with the cavity 35, as shown in FIGS. 3 and 4. The insertion losses shown in FIG. 5 are a measure of the radiation losses between the input and the output, e.g., of an energy lost in the respective RF coupling structures 10 or 12 radiating away from the respective RF coupling structures 10 or 12 and into the surrounding environment. FIG. 5 shows that in the frequency range between 70 GHz and 83 GHz, the RF coupling structure 12 with the cavity 35 has at least 4.8 dB better insertion losses than the RF coupling structure 10 without the cavity.

Figure 6:
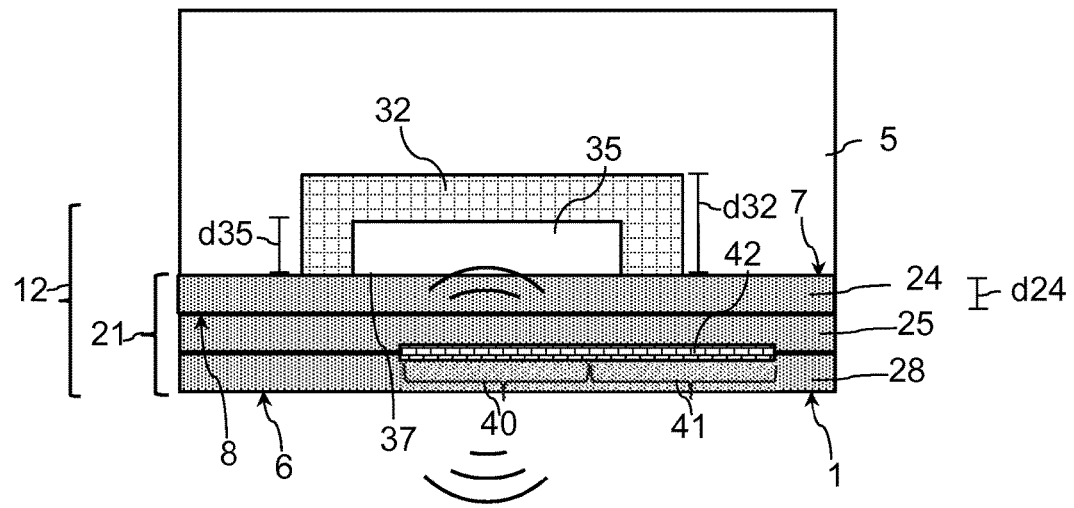
FIG. 6 shows a cross-section of an example of an integrated circuit package.

FIG. 6 shows a cross-section of another example of an integrated circuit package 53. The integrated circuit package 53 differs from the integrated circuit package 52 shown in FIGS. 3 and 4 in that a third electrically isolating layer 25 is formed between the first electrically isolating layer 24 and the second electrically isolating layer 28. The first, second and third electrically isolating layers 24, 28 and 25, form a stack 21 of electrically isolating layers. The integrated antenna structure 42 may be arranged between the first electrically isolating layer 24 and the third electrically isolating layer 25, as shown in FIG. 6. Alternatively, the integrated antenna structure 42 may be a planar antenna located between two electrically isolating layers other than the first electrically isolating layer 24 and the second electrically isolating layer 28. Alternatively, the integrated antenna structure 42 may be a non-planar single-ended or differential integrated antenna arranged between the first electrically isolating layer 24 and the third electrically isolating layer 25, and between the third electrically isolating layer 25 and the second electrically isolating layer 28. For example, the integrated antenna structure 42 may be formed with a first electrically conductive layer, e.g. made of copper, arranged between the first electrically isolating layer 24 and the third electrically isolating layer 25, and with a second electrically conductive layer arranged between the third electrically isolating layer 25 and the second electrically isolating layer 28. The first and second electrically conductive layers may be connected together via electrically conductive via holes extending through the third electrically isolating layer 25. For example, the integrated antenna structure 42 may have two patches of which a first patch is formed with the first electrically conductive layer and a second patch is formed with the second electrically conductive layer. The stack 21 may include more than the three electrically isolating layers 24, 28 and 25 and the integrated antenna structure 42 may be arranged between the three or more electrically isolating layers. By using the third electrically isolating layer 25, the physical distance between the integrated antenna structure 42 and the electrically conductive material 32 may be further increased. For example, the first electrically isolating layer 24 may have a first thickness d24 in a range of 10 to 20 um. The second and third electrically isolating layers 25 and 28 may have a respective second and third thicknesses equivalent to the first thickness. The opening 35 may have a depth d35 in a range of 75 to 100 um, whereas the thickness d32 of the electrically conductive material d32 may be in a range of 125 to 200 um. In this example, the third electrically isolating layer 25 may increase the distance of the integrated antenna structure 42 to the cavity 35 by 10 to 20 um.

Figure 7:
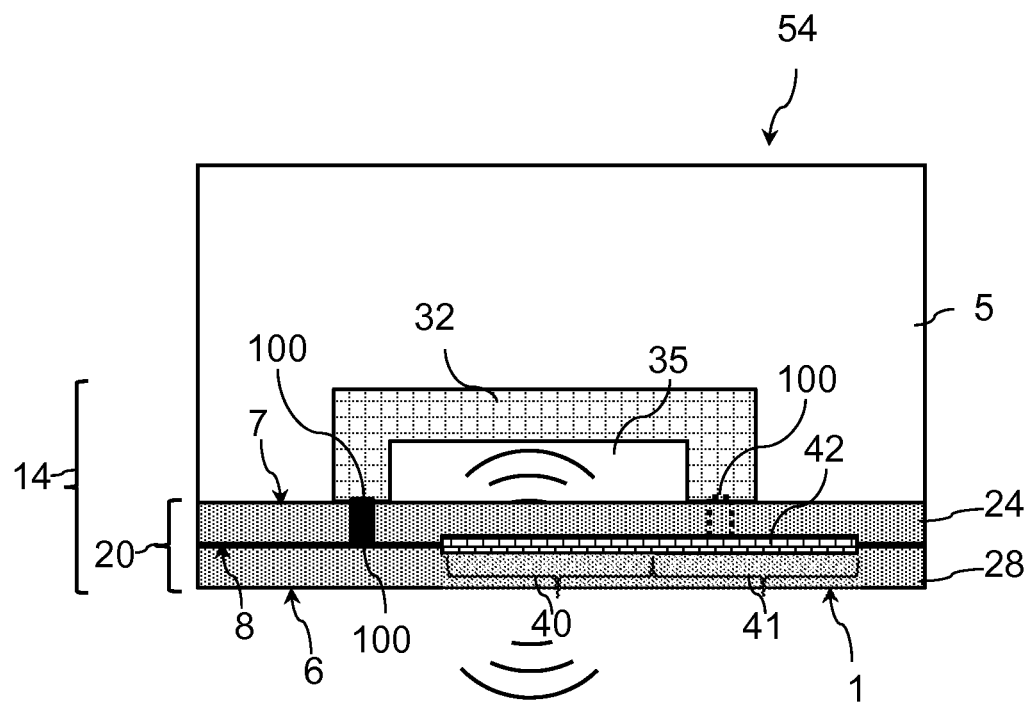
FIG. 7 shows a cross-section of an example of an integrated circuit package taken along the line VII-VII in FIG. 8.
Figure 8:
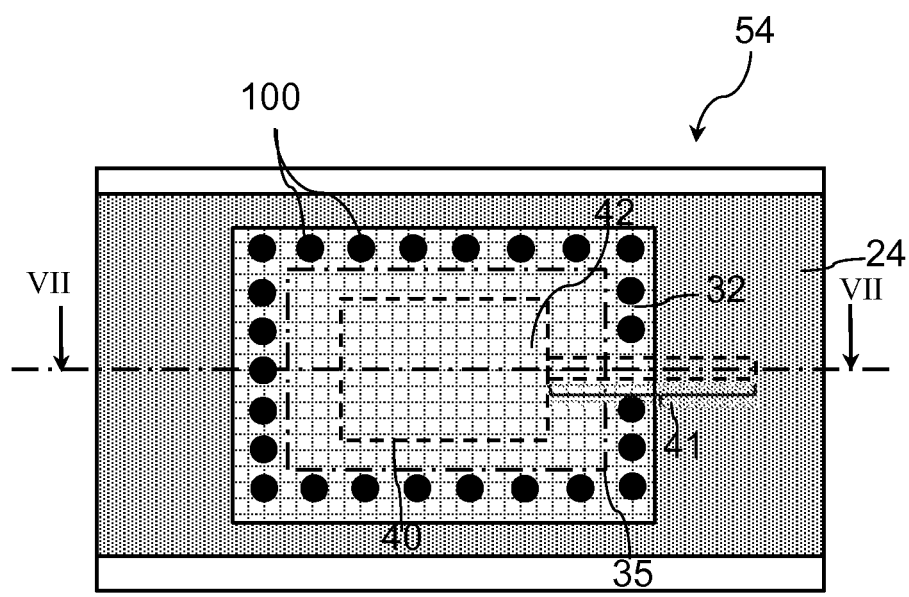
FIG. 8 shows a top view of the example shown in FIG. 7.

FIGS. 7 and 8 show a cross-section and a top view of another example of an integrated circuit package 54. Elements in the FIGS. 7 and 8 with the same reference numbers as in the FIGS. 3 and 4 have the same function and will be hereafter not described.

The integrated circuit package 54 differs from integrated circuit package 52 shown in FIGS. 3 and 4 in that the integrated antenna structure 42 may be surrounded by electrical conductive vias 100 extending through at least the first electrically isolating layer 24 and electrically connected to the electrically conductive material 32. The electrically conductive vias 100 may confine a radiating energy transferred between the integrated antenna structure 42 and the electrically conductive material 32 within a region of the RF coupling structure 14 delimited by the surrounding electrically conductive vias 100. The radiation losses of the RF coupling structure 14 may be further decreased. The electrically conductive vias 100 may further increase electromagnetic isolation between the RF coupling structure 14 and external electromagnetic sources, thereby reducing electromagnetic interferences. Electromagnetic sources external to the RF coupling structure 14 may interfere with the operation of the RF coupling structure 14. The external electromagnetic sources may be for example coming from other RF coupling structures adjacent to the RF coupling structure 14 and/or from other RF devices producing electromagnetic interferences. The electrically conductive vias 100 may be extending through the second electrically isolating layer 28 or, in case the stack 20 comprises more than two electrically isolating layers, as shown for example in the stack 21 of FIG. 6, through all electrically isolating layers of the stack 20.

Figure 9:
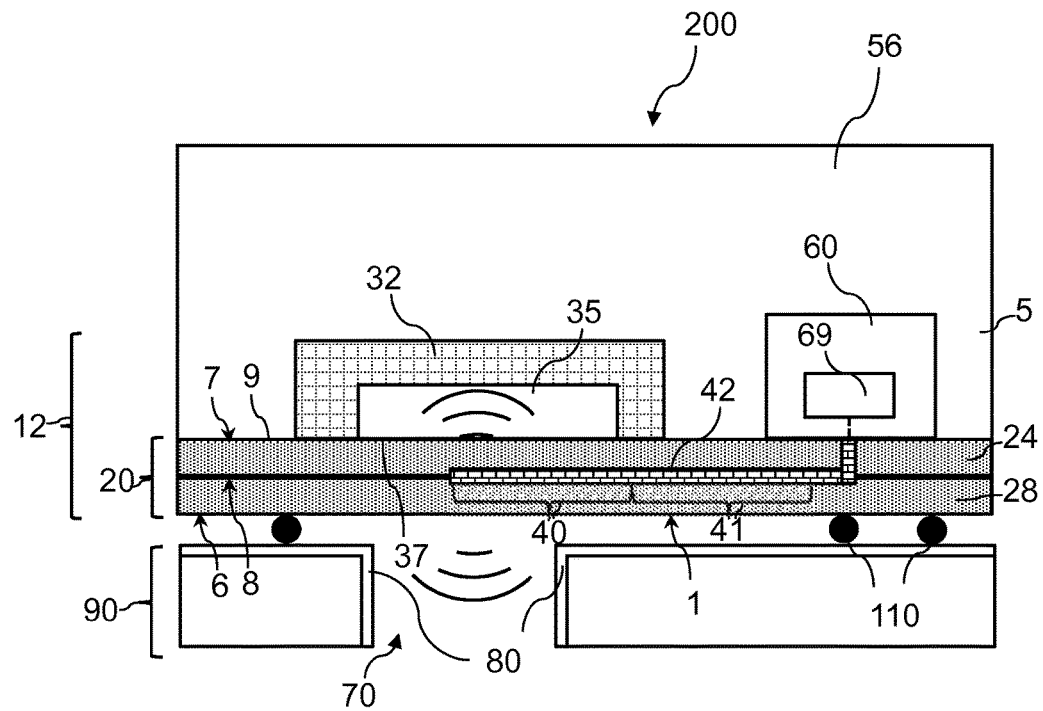
FIG. 9 shows a cross-section of an example of a radio frequency device.

FIG. 9 shows a cross-section of an example of a radio frequency device 200. The RF device 200 comprises an integrated circuit package 56 and a printed circuit board (PCB) 90 on which the integrated circuit package 56 is mounted via a plurality of solder balls 110. The integrated circuit package 56 comprises the RF coupling structure 12 as shown in FIG. 3. The RF coupling structure 12 comprises an integrated antenna structure 42 and the electrically conductive material 32 having the cavity 35. The integrated antenna structure 42 may be surrounded by electrically conductive vias as shown in FIG. 8. The PCB 90 comprises an RF waveguide 70 located at the package side 1 of the integrate circuit package 56. The integrated antenna structure 42 may comprise a planar rectangular patch element 40 which may be electrically coupled, e.g. via the transmission line 41, to an integrated circuit die 60. The integrated circuit die 60 may be arranged to generate the RF signal. The RF signal may be transmitted via the integrated antenna structure 42. The integrated circuit die 60 may be arranged to receive the RF signal as received via the integrated antenna structure 42. The integrated circuit package 56 is mechanically attached to the RF waveguide 70 via the solder balls 110. The RF waveguide 70 is arranged to guide the RF signal out of a plane parallel to a surface 9 of the first electrically isolating layer 24 at the first side 7. The RF signal may be directly transmitted away from integrated circuit package 56 towards the RF waveguide 70 via the integrated antenna structure 42. Alternatively or additionally, the RF signal may indirectly be transmitted away from integrated circuit package 56 towards the RF waveguide 70 via the integrated antenna structure 42 and via one or more reflections of the RF signal with the electrically conductive material 32. The RF signal may be received from the package side 1 via the waveguide 70 and directed towards the integrated circuit package 56. The RF signal may be directly received by the integrated antenna structure 42 from the package side 1. Alternatively or additionally, the RF signal may indirectly be received by the integrated antenna structure 42 from the package side 1 after one or more reflections with the electrically conductive material 32. As shown in FIG. 9, the RF waveguide 70 may be formed in the PCB 90. The RF waveguide 70 may be formed via a hole formed in the PCB 90 extending to an area of the integrated circuit package 56 corresponding to the RF coupling structure 12. This area may overlap the integrated antenna structure 42. This area may for example overlap the planar rectangular patch element 40. Alternatively, the area may partly overlap the integrated antenna structure 42. For example, the area may partly overlap the planar rectangular patch element 40. The hole may have lateral walls in the PCB 90 covered by an electrically conductive layer 80 within which the RF signal may be guided.

The integrated circuit die 60 may be arranged inside the integrated circuit package 56 as shown in FIG. 9. The integrated circuit die 60 may have a surface in direct contact with the surface 9 at the first side 7. The integrated circuit die 60 may be soldered to the surface 9 of the first electrically isolating layer 24 and in electrical contact with the transmission line 41 via one or more electrically conductive via holes extending through at least the first electrically isolating layer 24. Alternatively, in an example not shown in the Figures, the integrated circuit die 60 may be arranged outside the integrated circuit package 56 and electrically connected to the integrated antenna structure 42 via for example a lead terminal of the integrated circuit package.

The integrated circuit die 60 may comprise a circuit arranged to generate the RF signal. Alternatively or additionally, the circuit may be arranged to receive the RF signal as received via the integrated antenna structure 42. The circuit may be of any type suitable for the specific implementation.

For example, the integrated circuit die 60 may comprise a circuit 69 of the group of circuits consisting of: a transceiver, a receiver and a transmitter.

The integrated circuit die 60 may be manufactured with any semiconductor technology suitable for the specific implementation. For example, the integrated circuit die 60 may be manufactured using a semiconductor technology of the group of semiconductor technologies comprising: a silicon, a silicon germanium, a gallium arsenide, a gallium nitride semiconductor technology or a combination thereof.

Figure 10:
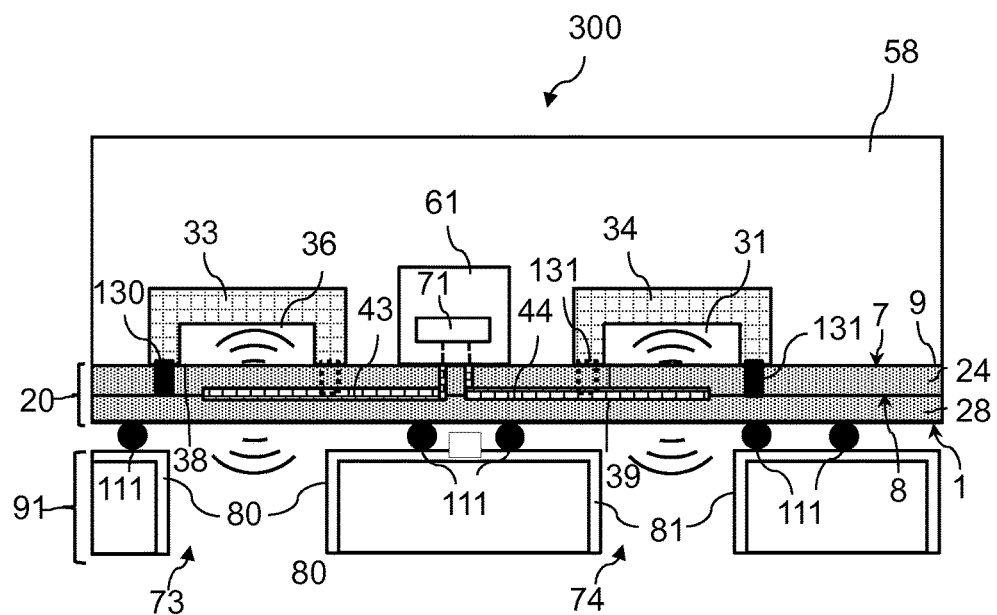
FIG. 10 shows a cross-section of an example of a radio frequency device.

FIG. 10 shows a cross-section of another example of a radio frequency device 300. The RF device 300 comprises an integrated circuit package 58 comprising two RF coupling structures with a first integrated antenna structure 43 and a second integrated antenna structure 44, and a first electrically conductive material 33 and a second electrically conductive material 34, respectively. The first and second integrated antenna structures 43 and 44 may be both sandwiched between the first electrically isolating layer 24 and the second electrically isolating layer 28. The first integrated antenna structure 43 and the second integrated antenna structure 74 may be both surrounded by electrically conductive vias 130 and 131, respectively. The electrically conductive vias 130 and 131 may be extending through at least the first electrically isolating layer 24. The first electrically conductive material 33 may have a first cavity 36 and the second electrically conductive material 34 may have a second cavity 31. The first cavity 36 may have a first opening 38 facing the first side 7. The second cavity 31 may have a second opening 39 facing the first side 7. The first integrated antenna structure 43 may be electrically coupled, e.g. via a first transmission line and one or more first via holes, to the integrated circuit die 61. The second integrated antenna structure 44 may be electrically coupled, e.g. via a second transmission line and one or more second via holes, to the same integrated circuit die 61. The integrated circuit die 61 may include the circuit 71. The circuit 71 may be of the same type of devices as described with reference to the circuit 69 shown in FIG. 9. The circuit 71 may be arranged to transmit a first RF signal in a first predetermined frequency band and a second RF signal in a second predetermined frequency band. Alternatively or additionally, the circuit 71 may be arranged to receive a first RF signal in a first predetermined frequency band and a second RF signal in a second predetermined frequency band. The first antenna structure 43 may be arranged for transmission in the first predetermined frequency band. Alternatively or additionally, the first antenna structure 43 may be arranged for receiving in the first predetermined frequency band. The second antenna structure 44 may be arranged for transmission in the second predetermined frequency band. Alternatively or additionally, the second antenna structure 44 may be arranged for receiving in the second predetermined frequency band.

The integrated circuit package 58 is mounted on the PCB 91 at the package side 1 of the integrated circuit package 58 via solder balls 111. The PCB 91 comprises a first RF waveguide 73 and a second RF waveguide 74. The first RF waveguide 73 is located at a first area at the package side 1 of the integrated circuit package 58 adjacent to the first antenna structure 43. The second RF waveguide 74 is located at a second area at the package side 1 of the integrated circuit package 58 adjacent to the second antenna structure 44. The integrated circuit package 58 is mechanically attached to the PCB 91 via solder balls 111. The integrated circuit package 58 is electrically coupled to the first RF waveguide 73 to guide the first RF signal in the PCB 91 out of the plane parallel to the surface 9 of the first electrically isolating layer 24. The integrated circuit package 58 is electrically coupled to the second RF waveguide 74 to guide the second RF signal in the PCB 91 out of the plane parallel to the surface 9. The first RF signal and the second RF signal may be transmitted away from the integrated circuit package 58. The first RF signal and the second RF signal may be transmitted towards the integrated circuit package 58. The first RF waveguide 73 and the second RF waveguide 74 may be both formed in the PCB 91 by arranging two separate holes extending through the PCB 91. The two separate holes may extend to an area of the respective first and second RF coupling structures overlapping or partly overlapping the respective first and second integrated antenna structures 43 and 44.

The RF device 300 may be used as a two-frequency channels RF device. For example the first RF signal may be received and/or transmitted in the first predetermined frequency band and the second RF signal may be received and/or transmitted in the second predetermined frequency band. The first predetermined frequency band may overlap the second predetermined frequency band. Alternatively, the first predetermined frequency band may not overlap the second predetermined frequency band. More than two RF coupling structures may be integrated in the same integrated circuit package and electrically coupled to more than two RF waveguides in order to provide an RF device with more than two frequency channels.

The RF devices 200 or 300 may be used in RF systems of one of the group of RF systems comprising: a wireless LAN, an E-band backhaul, a radar system. For example, the RF devices 200 or 300 may be a radar sensor working at any frequency range suitable for the specific radar system. For example, in a short detection range radar system, e.g., within 5 to 10 meters detection range, the radar sensors may be working at a frequency range of 24-25 GHz, for an intermediate and long detection range radar system, e.g., within 100 meters detection range and beyond, the radar sensors may be working at a frequency range of 76-81 GHz.

Figure 11:
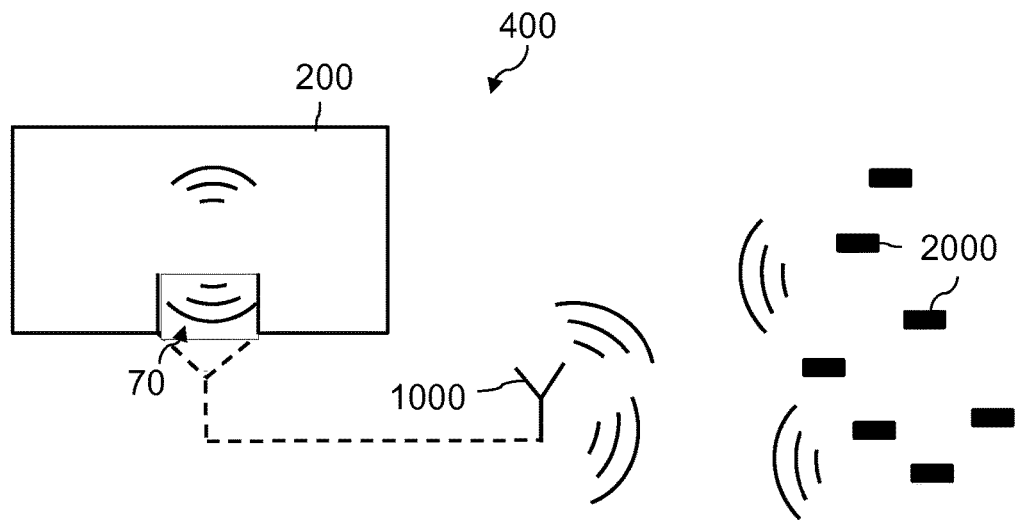
FIG. 11 schematically shows an example of a radar sensor.

FIG. 11 schematically shows an example of a radar sensor 400. The radar sensor 400 comprises the RF device 200 as described in the example shown in FIG. 9 and an antenna 1000. The antenna 1000 may be electrically coupled to the RF waveguide 70, e.g. via a coaxial cable, an RF connector soldered or screwed in the PCB (not shown in FIG. 11). The antenna 1000 is electrically coupled to the RF waveguide 70 to transmit and/or receive the RF signal through a frequency channel. The radar sensor 200 may detect a set of targets 2000 in a field of view of e.g. an automotive vehicle within a predetermined detection range. The RF signal may be transmitted from a transceiver in the RF device 200 via the RF waveguide 70, and via the antenna 1000 to the targets 2000. The RF signal may be reflected back from the set of targets 2000 to the antenna 1000. The transceiver in the RF device 200 may receive the RF signal reflected back from the set of targets 2000.

Figure 12:
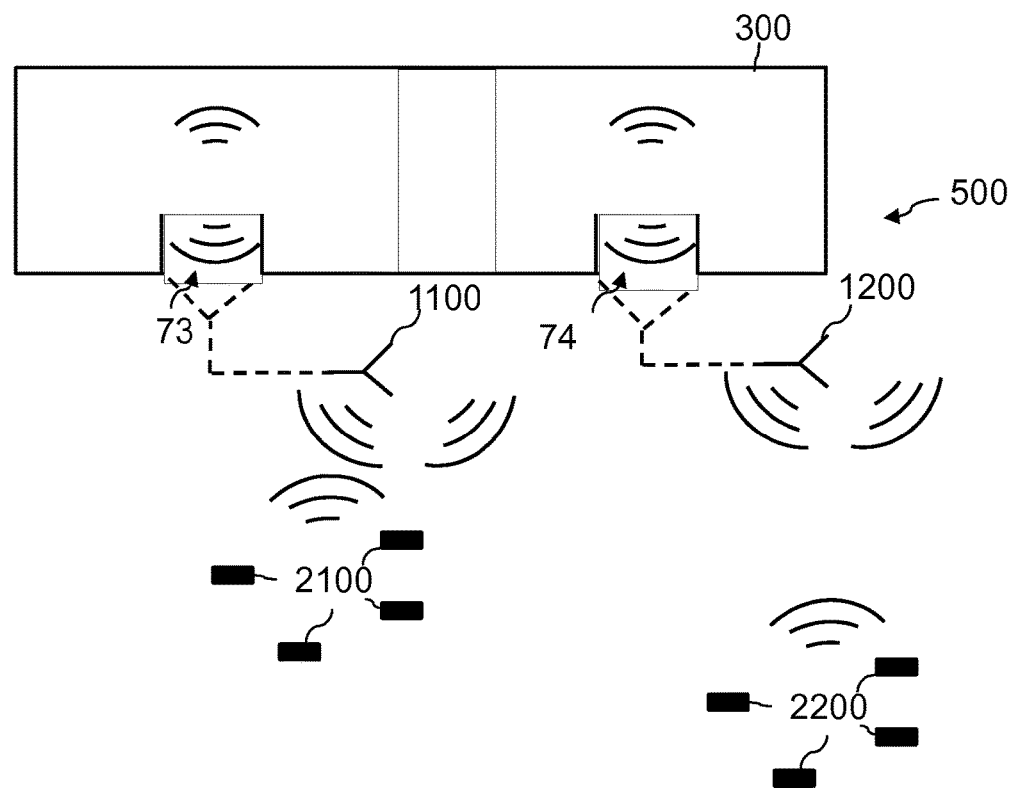
FIG. 12 schematically shows an example of a radar sensor.

FIG. 12 schematically shows another example of a radar sensor 500. The radar sensor 500 may comprise a radio frequency device 300 as described with reference to FIG. 10. The RF device 300 comprises a first RF waveguide 73 and a second RF waveguide 74. The first RF waveguide is electrically coupled to a first antenna 1100 and the second RF waveguide 74 is electrically coupled to a second antenna 1200. The first antenna 1100 may be arranged to transmit and/or receive a first RF signal in a first predetermined frequency band. The second antenna 1200 may be arranged to transmit and/or receive a second RF signal in a second predetermined frequency band. The first predetermined band may overlap the second predetermined frequency band. Alternatively, the first predetermined band may not overlap the second predetermined frequency band. The first RF waveguide 73 may be coupled, as described with reference to the example shown in FIG. 10, to a transceiver arranged to transmit and/or receive in the first predetermined frequency band. The second RF waveguide 74 may be coupled to the same or another transceiver arranged to transmit and/or receive in the second predetermined frequency band. The radar sensor 500 may detect a first set of targets 2100 within a first predetermined detection range and a second set of targets 2200 within a second predetermined detection range. Alternatively or additionally, the radar sensor 500 may detect the first set of targets 2100 within a first predetermined velocity range and a second set of targets 2200 within a second predetermined velocity range. The radar sensor 500 may use the first predetermined frequency band to detect the first set of targets 2100 within the first predetermined detection range and the second predetermined frequency band to detect the second set of targets 2200 within the second predetermined detection range. Alternatively or additionally, the radar sensor 500 may use the first predetermined frequency band to detect the first set of targets 2100 within the first predetermined velocity range and the second predetermined frequency band to detect the second set of targets 2200 within the second predetermined velocity range. The first predetermined detection range may be smaller or higher than the second predetermined detection range. The first predetermined velocity range may be smaller or higher than the second predetermined velocity range.

Figure 13:
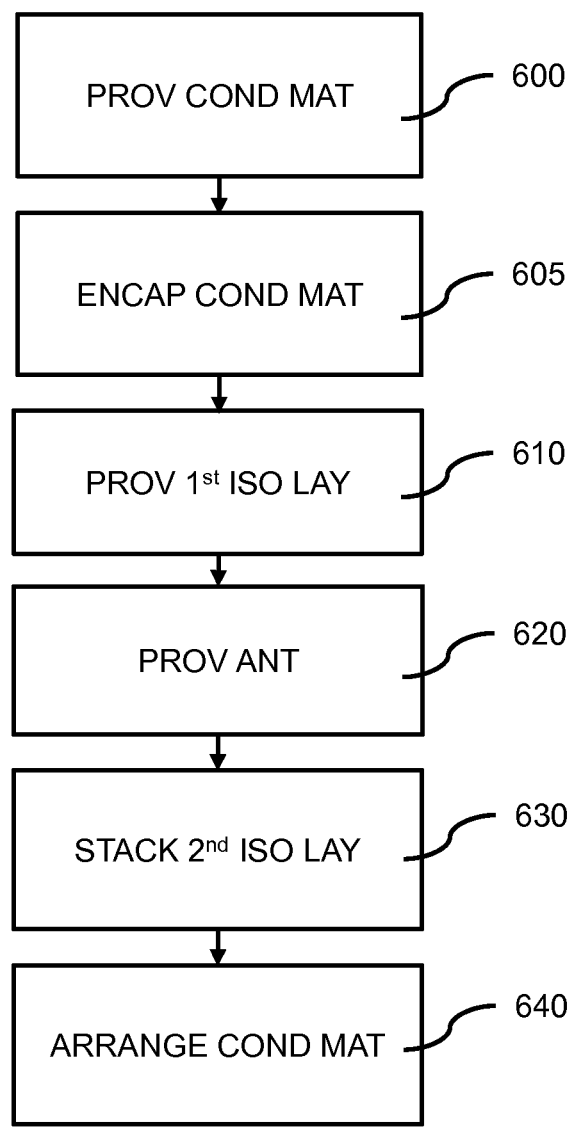
FIG. 13 schematically shows a flow diagram of a method of manufacturing an integrated circuit package.

FIG. 13 schematically shows a flow diagram of a method of manufacturing an integrated circuit package. The integrated circuit package may be any of the integrated circuit packages 50, 52, 53, 54, 56, or 58 described with reference to the FIGS. 1-4, 6 and 7-10. With reference to the example of FIG. 1, the method comprises: providing 600 an electrically conductive material 30, encapsulating 605 the electrically conductive material 30 with a dielectric material 5, providing 610 a first electrically isolating layer 24 having a first side 7 in contact with the electrically conductive material 30 and a second side 8 opposite to the first side 7. The method comprises providing 620 an integrated antenna structure 42 such that the integrated antenna structure 42 is separated from the electrically conductive material 30 by at least the first electrically isolating layer 24, and stacking 630 a second electrically isolating layer 28 at the second side 8 with the first electrically isolating layer 24, such that the integrated antenna structure 42 is arranged between the first electrically isolating layer 24 and the second electrically isolating layer 28 and a third side 6 of the second electrically isolating layer 28 is arranged at a package side 1. The method comprises arranging 640 the electrically conductive material 30 to partly overlap the integrated antenna structure 42 and to reflect the radio frequency signal received by the electrically conductive material 30 through at least the first electrically isolating layer 24 to the package side 1.

With reference to FIG. 3, the method may comprise after providing 600, providing a cavity 35 in the electrically conductive material 32 such that an opening 37 of the cavity 35 is facing the first side 7. Alternatively, the electrically conductive material 32 may directly be provided with the cavity 35 in the integrated circuit package 52 and later be encapsulated with the dielectric material 5.

The method may comprise before or at the same time with providing 620 the integrated antenna structure 42, providing an electrical connection between the electrically conductive element 30 or the electrically conductive material 32 and a reference potential, e.g. the ground or a negative potential.

With reference to the example of the integrated circuit package 56 shown in FIG. 9, the method may further comprise providing an integrated circuit die 60 at the same time of the electrically conductive material 32. The integrated circuit die 60 may be placed with an active side in contact with the surface 9 at the first side 7. The integrated circuit die 60 may be electrically connected to the integrated antenna structure 42 by forming electrically conductive vias extending through at least the first electrically isolating layer 24. The integrated circuit die 60 may be electrically connected to the reference potential via the electrically conductive material 32. The integrated circuit die 60 may for example be connected to the electrically conductive material 32 with electrically conductive vias connected to both the integrated circuit die 60 and the electrically conductive material 32 extending through the first electrically isolating layer 24, and metal lines arranged between the first and the second electrically isolating layers 24 and 28 connected to said electrically conductive vias. The electrically conductive material 32 and the integrated circuit die 60 may for example be placed as separate components on a face of a substrate corresponding to the surface 9. The electrically conductive material 32 together with the integrated circuit die 60 may be encapsulated with a dielectric material 5, e.g. a moulding compound such as a silica-filled epoxy moulding compound, to obtain a panel comprising the electrically conductive material 32, the integrated circuit die 60, the substrate and the moulding compound. After curing the panel, the panel may be released from the substrate. After releasing the panel from the substrate, part of the remaining substrate may form the first electrically isolating layer 24. Alternatively, after releasing the panel from the substrate, a batch lithography process may be used to form the first electrically isolating layer 24. The integrated antenna structure 42 may then be formed by deposition of a patterned copper metallization layer on the first electrically isolating layer 24. Electroplating techniques may be used for the deposition of the patterned copper metallization layer. After the integrated antenna structure 42 is formed, the second electrically isolating layer 28 maybe formed on the first electrically isolating layer 24 such that the integrated antenna structure 42 is sandwiched between the first electrically isolating layer 24 and the second electrically isolating layer 28.

The integrated circuit package 50 to 58 shown through the FIGS. 1-4, 6-10 may for example be manufactured using a technology referred as a redistributed circuit chip package (RCP) technology described in Keser B. at al., "The Redistributed Chip Package: A Breakthrough for Advanced Packaging", *Electronic Components and Technology Conference, 2007 Proceedings. 57th*, pp. 286-291, 2007, incorporated herein by reference.

The RCP technology allows to route signals within the electrically isolating layers 24 and 28, to for example electrically connect the electrically conductive material 30, 32, 33 or 34 to the ground connection of the integrated circuit die 60. The electrically conductive material 30, 32, 33 or 34 can be electrically connected to the integrated circuit die 60 or 61 and be used both as a ground plane and as a radio frequency reflector. Furthermore, the electrically conductive material 30, 32, 33 or 34 may be a thick separate element in the package, and be encapsulated in the dielectric material 5 of the package. For example, the electrically conductive material 30, 32, 33 or 34 may additionally be used as an internal heat sink electrically connected to a ground connection of the integrated circuit die 60 or 61.

In the foregoing specification, the invention has been described with reference to specific examples of embodiments of the invention. It will, however, be evident that various modifications and changes may be made therein without departing from the scope of the invention as set forth in the appended claims. For example, the electrical connections may be any type of electrical connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device. For example, as shown through the FIGS. 9 and 10, a single integrated circuits die 60, 61 may integrate a transmitter and a receiver. However, the transmitter and the receiver may be integrated in separate integrated circuit dies both electrically coupled to the respective integrated antenna structures. For example, in FIG. 10, in place of the single integrated circuit die 61, two separate integrated circuit dies may be arranged inside the integrated circuit package 58. The two separate integrated circuit dies may be electrically coupled to the respective first and second integrated antenna structures 43 and 44 for transmitting and/or receiving the respective first and second RF signals in the respective first and second predetermined frequency bands.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency device comprising:
   an integrated circuit package comprising a radio frequency coupling structure arranged inside the integrated circuit package, the radio frequency coupling structure comprising:
   an electrically conductive material, the electrically conductive material having a cavity surrounded by side walls of the electrically conductive material, the cavity having at least one opening;
   a first electrically isolating layer having a first side in contact with the side walls of the electrically conductive material and with the opening of the cavity facing the first side of the first electrically isolating layer such that only the side walls of the electrically conductive material are in direct contact with the first electrically isolating layer, and the first electrically isolating layer having a second side opposite to the first side;
   a second electrically isolating layer stacked at the second side with at least the first electrically isolating layer and having a third side arranged at a package side of the integrated circuit package;
   an integrated antenna structure for at least one of transmitting and receiving a radio frequency signal, the integrated antenna structure being arranged between the first electrically isolating layer and the second electrically isolating layer with the opening of the cavity facing the integrated antenna structure;
   the electrically conductive material being encapsulated by a dielectric material, the electrically conductive material being arranged to partly overlap the integrated antenna structure and being separated from the integrated antenna structure by at least the first electrically isolating layer, the electrically conductive material being arranged to reflect the radio frequency signal received by the electrically conductive material through at least the first electrically isolating layer to the package side; and a printed circuit board (PCB), the package side of the integrated circuit package being mounted on the PCB, wherein the PCB has a hollow radio frequency waveguide formed therein via a hole extending through the entire thickness of the PCB, the hole having lateral walls covered by an electrically conductive layer, the hole extending to an area of the radio frequency coupling structure partly overlapping the integrated antenna structure, and wherein the integrated circuit package is electrically coupled to the radio frequency waveguide and the radio frequency waveguide is configured to guide the radio frequency signal out of a plane parallel to a surface of the first electrically isolating layer at the first side.

2. An integrated circuit package according to claim 1, the cavity being filled with a dielectric material.

3. An integrated circuit package according to claim 1, the integrated antenna structure being surrounded by electrical conductive vias extending through at least the first electrically isolating layer and being electrically connected to the electrically conductive material.

4. An integrated circuit package according to claim 1, the electrically conductive material being electrically connected to a reference potential.

5. A integrated circuit package according to claim 1, the integrated antenna structure being an integrated planar antenna of one of the group consisting of: a single-ended microstrip antenna, a differential microstrip antenna, a rectangular patched single-ended antenna, a rectangular patched differential antenna, a square patched single-ended antenna, a square patched differential antenna.

6. An integrated circuit package according to claim 1, the integrated antenna structure being electrically coupled to an integrated circuit die arranged to at least one of generate the radio frequency signal for transmission via the integrated antenna structure and receive the radio frequency signal as received via the integrated antenna structure.

7. An integrated circuit package according to claim 6, the integrated circuit die being arranged inside the integrated circuit package and having a surface in direct contact with the first side.

8. An integrated circuit package according to claim 6, the integrated circuit die comprising a circuit of the group of circuits consisting of: a transmitter, a receiver, and a transceiver, the circuit being electrically coupled to the integrated antenna structure.

9. An integrated circuit package according to claim 6, the integrated circuit die being manufactured using a semiconductor technology of the group of semiconductor technologies comprising: a silicon, a silicon germanium, a gallium arsenide, a gallium nitride semiconductor technology, or a combination thereof.

10. An integrated circuit package according to claim 6, the integrated antenna structure further being arranged for at least one of transmitting and receiving the radio frequency signal in a first predetermined frequency band and the integrated circuit package further comprising:

a second radio frequency coupling structure being arranged inside the integrated circuit package, and comprising:

a second electrically conductive material arranged inside the integrated circuit package in contact with the first side;

a second integrated antenna structure for at least one of transmitting and receiving a second radio frequency signal in a second predetermined frequency band, the second integrated antenna structure being arranged between the first electrically isolating layer and the second electrically isolating layer, and the second integrated antenna structure being electrically coupled to the integrated circuit die to at least one of generate the further radio frequency signal for transmission via the further integrated antenna structure and receive the further radio frequency signal as received via the further integrated antenna structure; and the second electrically conductive material being arranged to partly overlap the second integrated antenna structure and being separated from the second integrated antenna structure by at least the first electrically isolating layer, the second electrically conductive material being arranged to reflect the second radio frequency signal received by the second electrically conductive material through at least the first electrically isolating layer to the package side.

11. An integrated circuit package as claimed in claim 1, the integrated antenna structure being arranged for at least one of transmitting and receiving the radio frequency signal in a first predetermined frequency band and the integrated circuit package further comprising:

a second radio frequency coupling structure being arranged inside the integrated circuit package, and comprising:

a second electrically conductive material arranged inside the integrated circuit package in contact with the first side;

a second integrated antenna structure for at least one of transmitting and receiving a second radio frequency signal in a second predetermined frequency band, the second integrated antenna structure being arranged between the first electrically isolating layer and the second electrically isolating layer; and the second electrically conductive material being arranged to partly overlap the second integrated antenna structure and being separated from the second integrated antenna structure by at least the first electrically isolating layer, the second electrically conductive material being arranged to reflect the second radio frequency signal received by the second electrically conductive material through at least the first electrically isolating layer to the package side.

12. An integrated circuit package as claimed in claim 11, the second electrically conductive material having a second cavity having at least a second opening facing the first side.

13. An integrated circuit package as claimed in claim 11, the second integrated antenna structure being surrounded by further electrical conductive vias extending through at least the first electrically isolating layer and being electrically connected to the further electrically conductive material.

14. A radio frequency device as claimed in claim 1 wherein the hollow radio frequency waveguide is a first radio frequency waveguide, and the radio frequency device further comprises:

a second radio frequency waveguide located at a second area at the package side of the integrated circuit package adjacent to the second integrated antenna structure, the integrated circuit package being electrically coupled to the second radio frequency waveguide to guide the second radio frequency signal out of the plane parallel to the surface.

15. A radio frequency device as claimed in claim 14, the second radio frequency waveguide being formed via a second hole through the printed circuit board, the printed circuit board being arranged at the package side, the second hole having further lateral walls covered by a second electrically conductive layer, the second hole extending to an area of the second radio frequency coupling structure partly overlapping the second integrated antenna structure.

16. A radar sensor for detecting targets in a field of view comprising the integrated circuit package as claimed in claim 1, the radar sensor further comprising:
   an antenna electrically coupled to the radio frequency wave guide for transmitting the radio frequency signal through a frequency channel.

17. A method of manufacturing an integrated circuit package, the method comprising:
   providing an electrically conductive material inside the integrated circuit package, the electrically conductive material having a cavity surrounded by side walls of the electrically conductive material, the cavity having at least one opening;
   encapsulating the electrically conductive material with a dielectric material;
   providing a first electrically isolating layer having a first side in contact with the side walls of the electrically conductive material and with the opening of the cavity facing the first side of the first electrically isolating layer such that only the side walls of the electrically conductive material are in direct contact with the first electrically isolating layer, and the first electrically isolating layer having a second side opposite to the first side;
   providing an integrated antenna structure such that the integrated antenna structure is separated from the electrically conductive material by at least the first electrically isolating layer with the opening of the cavity facing the integrated antenna structure;
   stacking a second electrically isolating layer at the second side with at least the first electrically isolating layer, such that the integrated antenna structure is arranged between the first electrically isolating layer and the second electrically isolating layer and a third side of the second electrically isolating layer is arranged at a package side of the integrated circuit package;
   arranging the electrically conductive material such to partly overlap the integrated antenna structure and to reflect the radio frequency signal received by the electrically conductive material through at least the first electrically isolating layer to the package side; and
   mounting the integrated circuit package on a printed circuit board (PCB), the package side of the integrated circuit package being mounted on the PCB, wherein the PCB has a hollow radio frequency waveguide formed therein via a hole extending through the entire thickness of the PCB, the hole having lateral walls covered by an electrically conductive layer, the hole extending to an area of the radio frequency coupling structure partly overlapping the integrated antenna structure, and wherein the integrated circuit package is electrically coupled to the radio frequency waveguide and the radio frequency waveguide is configured to guide the radio frequency signal out of a plane parallel to a surface of the first electrically isolating layer at the first side.

* * * * *